(12) United States Patent
Levi (10) Patent No.: US 7,463,998 B2
(45) Date of Patent: Dec. 9, 2008

(54) ADAPTIVE DESIGN OF NANOSCALE ELECTRONIC DEVICES

(75) Inventor: Anthony Levi, Los Angeles, CA (US)

(73) Assignee: University of Southern California, Los Angeles, CA (US)

( * ) Notice: Subject to any disclaimer, the term of this patent is extended or adjusted under 35 U.S.C. 154(b) by 0 days.

(21) Appl. No.: 11/673,319

(22) Filed: Feb. 9, 2007

(65) Prior Publication Data
US 2007/0198204 A1    Aug. 23, 2007

Related U.S. Application Data

(60) Provisional application No. 60/776,073, filed on Feb. 23, 2006.

(51) Int. Cl.
G06F 19/00    (2006.01)
(52) U.S. Cl. .......................................... 702/181; 438/17
(58) Field of Classification Search ................. 702/181, 702/182, 183, 184, 185, 108; 438/17
See application file for complete search history.

(56) References Cited

U.S. PATENT DOCUMENTS

| | | | |
|---|---|---|---|
| 3,965,338 | A | 6/1976 | Gerwin et al. |
| 6,033,233 | A | 3/2000 | Haseyama |
| 6,064,088 | A | 5/2000 | D'Anna |
| 6,195,790 | B1 | 2/2001 | Tanimoto et al. |
| 6,740,928 | B2 | 5/2004 | Yoshii et al. |

2005/0087131 A1 * 4/2005 Shtein et al. ................. 118/715

OTHER PUBLICATIONS

International Search Report for PCT Application No. PCT/US07/04790, International Filing Date, Feb. 23, 2007. Search Report mailed Apr. 21, 2008.
Bastard G., Superlattice band structure in the envelope-function approximation, Physical Review B, vol. 24, No. 10. , The American Physical Society, College Park, MD.
Buttiker M, Imry Y, Landauer R, Pinhas S., Generalized many-channel conductance formula with application to small rings, Physical Review B, May 15, 1985, pp. 6207-6215, vol. 31, No. 10, The American Physical Society, College Park, MD.
Landauer Rolf, Electrical resistance of disordered one-dimensional lattices, Philosophical Magazine, Apr. 1970, pp. 863-867, vol. 21, Iss. 172, IBM, T. J. Watson Research Center, Yorktown Heights, NY.
Landauer Rolf, Spatial variation of currents and fields due to localized scatterers in metallic conduction, IBM Journal, Jul. 1957, pp. 223-231, IBM, T. J. Watson Research Center, Yorktown Heights, NY.

(Continued)

*Primary Examiner*—Edward Raymond
(74) *Attorney, Agent, or Firm*—McDermott Will & Emery LLP (57) ABSTRACT

A method of fabricating a semiconductor device so as to cause the device to have a desired transfer characteristic. Computations may be performed that predict a transfer characteristic of the semiconductor device for each of a plurality of different sets of values of available control parameters that may be used during the fabrication of the semiconductor device. A set of values of available control parameters that the computations predict will cause the semiconductor device to substantially provide the desired transfer characteristic may be identified, and the semiconductor device may be fabricated based on these identified values.

25 Claims, 6 Drawing Sheets

OTHER PUBLICATIONS

Thalken Jason, Li Weifei, Haas Stephan, Levi A. F. J. Adaptive design of excitonic absorption in broken-symmetry quantum wells, Jul. 5, 2004, pp. 121-123, vol. 85, No. 1, American Institute of Physics, Melville, NY.

Wang Shyh, Fundamentals of semiconductor theory and device physics, Jun. 1989, pp. 272-273, 334-337, Prentice Hall, Englewood Cliffs, NJ.

* cited by examiner

ADAPTIVE DESIGN OF NANOSCALE ELECTRONIC DEVICES

CROSS-REFERENCE TO RELATED APPLICATION(S)

This application is based upon and claims priority to U.S. Provisional Patent Application Ser. No. 60/776,073, entitled "Adaptive Design of Nanoscale Electronic Devices," filed Feb. 23, 2006, the entire content of which is incorporated herein by reference.

STATEMENT REGARDING FEDERALLY SPONSORED RESEARCH

Portions of this invention have been made with government support under DARPA Grant No. N00014-05-1-0317, awarded by the United States Government. The government has certain rights in the invention.

BACKGROUND

1. Field

This disclosure relates to the fabrication of electronic devices, including semiconductor devices and nanoscale devices.

2. Description of Related Art

The scaling of semiconductor devices, such as transistors, may eventually be limited by quantum effects. In this situation, semiconductor device dimensions may be a few nanometers. The resulting electric fields may be large enough to give rise to tunneling and non-equilibrium behavior that includes ballistic electron transport. This may make it difficult to fabricate nanoscale and other semiconductor devices that provide a desired transfer characteristic, such as one that is a particular polynomial function.

SUMMARY

A method of fabricating a semiconductor device so as to cause the device to have a desired transfer characteristic. Computations may be performed that predict a transfer characteristic of the semiconductor device for each of a plurality of different sets of values of available control parameters that may be used during the fabrication of the semiconductor device. A set of values of available control parameters that the computations predict will cause the semiconductor device to substantially provide the desired transfer characteristic may be identified, and the semiconductor device may be fabricated based on these identified values.

The transfer characteristic may be an electron transmission characteristic and/or a current voltage characteristic.

Electron motion in the semiconductor device may be substantially limited by quantum mechanical transmission.

At least one of the available control parameters within each set of values may relate to the conduction or valence band within the semiconductor device. This band may be fabricated based on the value of the at least one control parameter within the set of values that is identified.

Each of the sets of values of available control parameters may include varying the local potential in spatial increments across the conduction or valence band.

The spatial increments may span less than 20 nm. Each of the spatial increments may be between the thickness of an atomic layer and 20 nm. The spatial increments may be substantially equal.

The local potentials may be selected from a discreet set of values.

The computations may be derived from a propagation matrix method that solves the Schrödinger equation in a piece-wise fashion.

The desired transfer characteristic of the semiconductor device may be for when electron motion in the semiconductor device is not at thermal equilibrium.

The desired transfer characteristic of the semiconductor device may be a polynomial function, such as a linear function or a squared function.

The sets of values on which computations are performed may be determined utilizing optimal design techniques.

A plurality of the semiconductor devices may be fabricated in accordance with the set of values of available fabrication control parameters that is identified.

A semiconductor device may provide a transfer characteristic that is a linear or squared function when electron motion in the semiconductor device is not at thermal equilibrium. The conduction or valence band in the semiconductor device may be configured to cause the semiconductor device to provide this transfer characteristic.

These, as well as other components, steps, features, objects, benefits, and advantages, will now become clear from a review of the following detailed description of illustrative embodiments, the accompanying drawings, and the claims.

BRIEF DESCRIPTION OF DRAWINGS

The drawings disclose illustrative embodiments. They do not set forth all embodiments. Other embodiments may be used in addition or instead. Details that may be apparent or unnecessary may be omitted to save space or for more effective illustration. When the same numeral appears in different drawings, it is intended to refer to the same or like components or steps.

DETAILED DESCRIPTION OF ILLUSTRATIVE EMBODIMENTS

Illustrative embodiments are now discussed. Other embodiments may be used in addition or instead. Details that may be apparent or unnecessary may be omitted to save space or for a more effective presentation.

Figure 1:
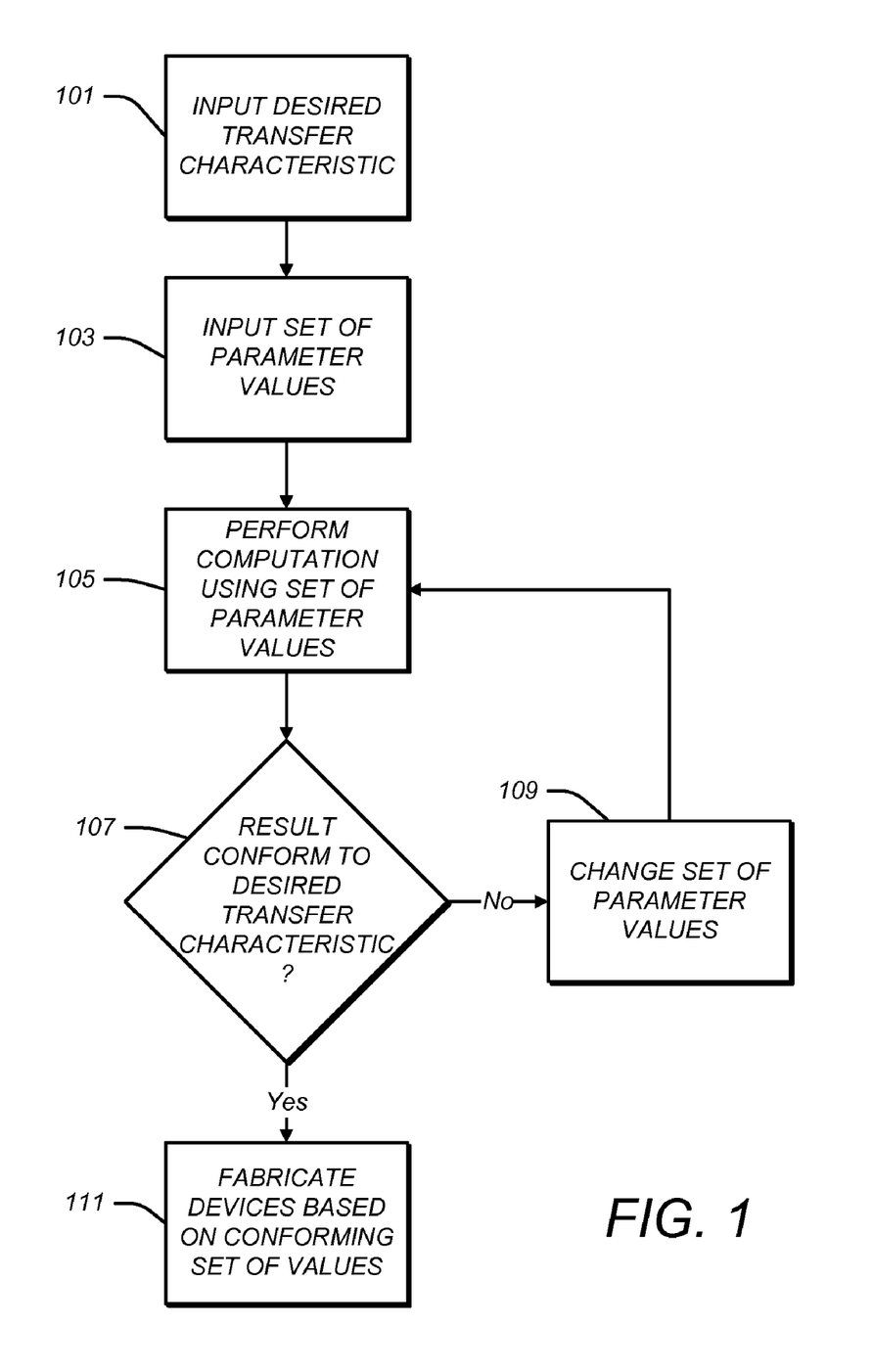
FIG. 1 illustrates a method for fabricating a semiconductor device.

FIG. 1 illustrates a method for fabricating a semiconductor device.

A desired transfer characteristic of a semiconductor device to be fabricated may be inputted into a computational system, such as a computer system, as reflected by an Input Desired Transfer Characteristic step 101. The desired transfer characteristic may be of any type. For example, it may be an electron transmission voltage characteristic and/or a current voltage characteristic of the device. It may in addition or instead be a temporal response or frequency response. The characteristic may be for when electron motion in the semiconductor device is not at thermal equilibrium.

A set of control parameter values may next be inputted into the computational system, as reflected by an Input Set of Parameter Values step 103. The control parameter values may specify available parameters of the semiconductor device to be fabricated. They may be of any type. For example, the control parameters may consist of or include values that specify the local potential in spatial increments across a conduction or valence band within the semiconductor device. Each set may differ from the other sets in any way. For example, each set may differ by specifying a different local potential in at least one of the spatial increments. Any means may be used to establish the initial values that are used.

A computation may be performed to determine a transfer characteristic of the semiconductor device when fabricated with the inputted set of parameter values, as reflected by a Perform Computation Using Set of Parameter Values step 105. An appropriate physical model of the semiconductor device that predicts the type of transfer characteristic that was inputted during the step 101 may be used for this purpose.

The results of this computation may be compared to the desired transfer characteristic that was inputted, as reflected by Conform to Desired Transfer Characteristic? decision step 107. If the computed transfer characteristic fails to conform to the desired transfer characteristic, one or more values in the set of parameters may be changed, as reflected by a Change Set of Parameter Values step 109. The computation may be performed again and the result may again be compared to the desired transfer characteristic. This process may repeat until the set of values results in a computation during the step 105 of a transfer characteristic that conforms during the step 107 to the desired transfer characteristic.

Various considerations may go into the determination of whether a particular set of values results in a conforming transfer function, other than merely the similarities between the calculated and desired transfer functions. For example, the costs of manufacturing the semiconductor device, its size, and/or other operational characteristics may be considered. In such a case, a particular set of parameter values may be determined to conform to the desired transfer function, even when a different set might conform more closely.

Optimal design techniques may be used during the steps of selecting the initial set of parameter values and/or during the step 109 of changing those initial values. The optimal design techniques may be configured to increase the speed at which a conforming set of values is tested and/or to reduce the amount or complexity of computations that need to be made.

One or more semiconductor devices may be fabricated based on the set of values that caused the calculated transfer function to conform to the desired transfer function, as reflected by a Fabricate Devices Based On Conforming Set of Values step 109. During this step, one or more semiconductor devices may be fabricated in accordance with the values in the identified set. Alternatively, one or more values in the identified set may be adjusted prior to or during the fabrication process.

Specific examples of certain of the steps that have now been described in connection with FIG. 1 will now be discussed in connection with the remaining figures.

Figure 2A:
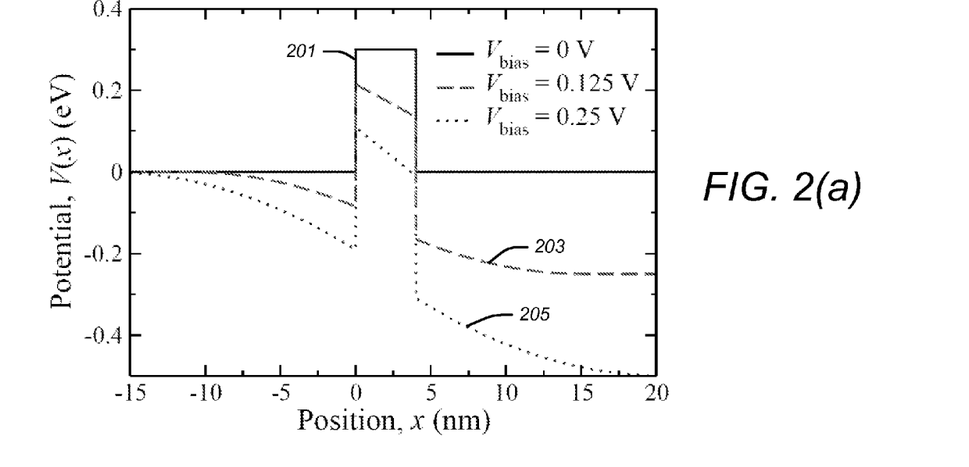
FIG. 2(a) illustrates a conduction band profile of a rectangular potential barrier for various values of bias voltage in a semiconductor device.

FIG. 2(*a*) illustrates a conduction band profile of a rectangular potential barrier for various values of bias voltage in a semiconductor device. As shown in FIG. 2(*a*), a rectangular barrier of energy band 201 may have an energy potential $V_0$ of about 0.3 eV and a width L of about 4 nm at a bias voltage $V_{bias}$, of 0V. The barrier may be sandwiched between n-type electrodes with a carrier concentration of $n=10^{18}$ cm$^{-3}$.

Various bias voltages $V_{bias}$, may be applied to the device and result in a depletion region on the right side and an accumulation region on the left side of the barrier. Examples of this are illustrated in FIG. 2(*a*) by energy band 203 for $V_{bias}=0.125V$ and energy band 205 for $V_{bias}=0.25V$.

The form of the conduction band profile $V_x$ in these regions may be calculated by solving the Poisson equation, more information about which may be found at S. Wang, *Fundamental of Semiconductor Theory and Device Physics,* Englewood Clffs, N.J.: Prentice Hall (1989), ISBN 0-13-344409-0, the entire content of which is incorporated by reference. Electron motion may be in the x-direction, normal to the barrier plane, and there may be no confinement in the y and z directions, thereby avoiding possible detrimental consequences of quantized conductance, as explained in more detail in R. Landauer, IBM J. Res. Dev. 1, 223 (1957), R. Landauer, Philo. Mag. 21, 863 (1970), M. Buttiker, Y. Imry, R. Landauer, and S. Pinhas, Phys. Rev. B 31, 6207 (1985), the entire content of all of which are incorporated herein by reference.

A numerical solution to the Schrödinger equation may be obtained piecewise by discretizing the potential profile into a plurality of steps, such as into 4000 steps. Boundary conditions at each interface may be matched. The solution may be implemented using the propagation matrix method, as explained in more detail in G. Bastard, Phys. Ref. B24, 5693 (1981), the entire content of which is incorporated herein by reference.

An electron of energy E=26 meV incident from the left may be partially reflected and partially transmitted. This may be determined by the wave function boundary conditions $\Psi_j = \Psi_{j+1}$ and $\partial \Psi_j / \partial \chi = \partial \Psi_{j+1} / \partial \chi$ at each interface. Here, $\Psi_j$ may be a solution of Schrödinger's equation in region j with wave vector $k_j = \sqrt{2m(E-eV_j)}/\hbar$, where $V_j$ may be the local potential in the conduction band and m may be the effective electron mass.

Figure 2B:
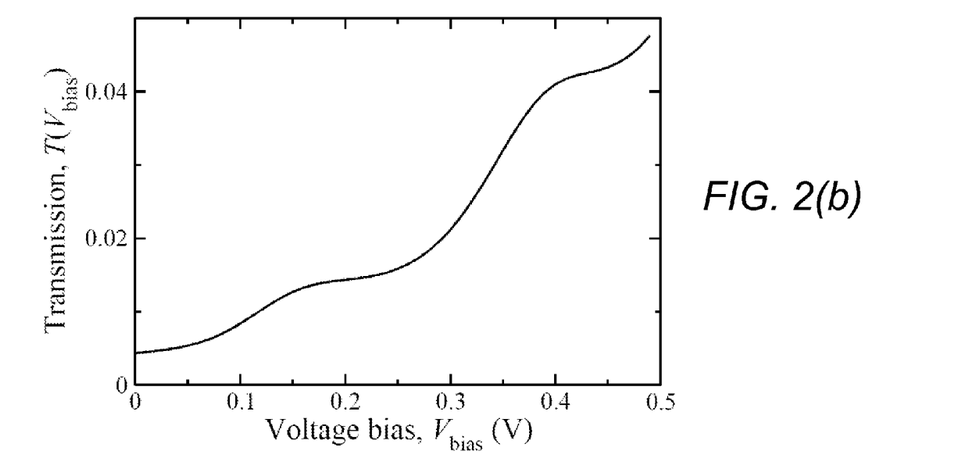
FIG. 2(b) illustrates the transmission probability of the semiconductor device illustrated in FIG. 2(a) as a function of bias voltage.

FIG. 2(*b*) illustrates the transmission probability of the semiconductor device illustrated in FIG. 2(*a*) as a function of bias voltage. As noted above, the graph may be for an electron of energy E=26 meV incident from the left.

As shown in FIGS. 2(*a*) and 2(*b*), a rectangular potential barrier of energy $V_0=0.3$ eV and width L=4 nm may give rise to a rapid increase in electron transmission with increasing voltage bias, $V_{bias}$ and resonances. Effective electron mass m may be equal to 0.07 $m_0$, where $m_0$ is the bare electron mass.

Exponential increase in electron transmission with bias voltage may be a generic feature of the simplest barrier profiles. Potential wells, on the other hand, may produce bound state resonances, leading to sharp transmission peaks. Hence, designs of structures with linear and other power-law transmission-voltage characteristics may be based on broken-symmetry potential barrier profiles.

An adaptive quantum design approach, as discussed in more detail in J. Thalken, W. Li, S. Haas, A. F. J. Levi, Appl. Phys. Lett. 85, 121 (2004), the entire content of which is incorporated herein by reference, may be used to find a potential profile with a transmission function $T(V_{bias})$ that increases linearly with bias voltage in the window $0 V < V_{bias} < 0.25$ V.

The conduction band potential energy profile on a grid may be defined with $\Delta x=2$ nm (~8 monolayers in GaAs) spatial increments and $\Delta V=0.01$ eV energy increments. The numerical search for an optimal broken-symmetry barrier profile may be constrained to take into account physical as well as computational limitations. Physically, varying the composition of an $Al_xGa_{1-x}As$ alloy may control the conduction band potential profile. Fabrication inaccuracies of 1-2 monolayers may occur in the epitaxial growth processes. The targeted transmission functionality may therefore need to remain stable against such variations. Moreover, the Al concentration may only be controlled to within a few percent. Computationally, the dimensionality of the search space may need to be constrained in order to match the available computer hardware capabilities. To keep the search space finite, nanoscale barrier structures may have a total width L=10 nm with a maximum on-site potential of 0.3 eV measured from the GaAs conduction band minimum.

Figure 3A:
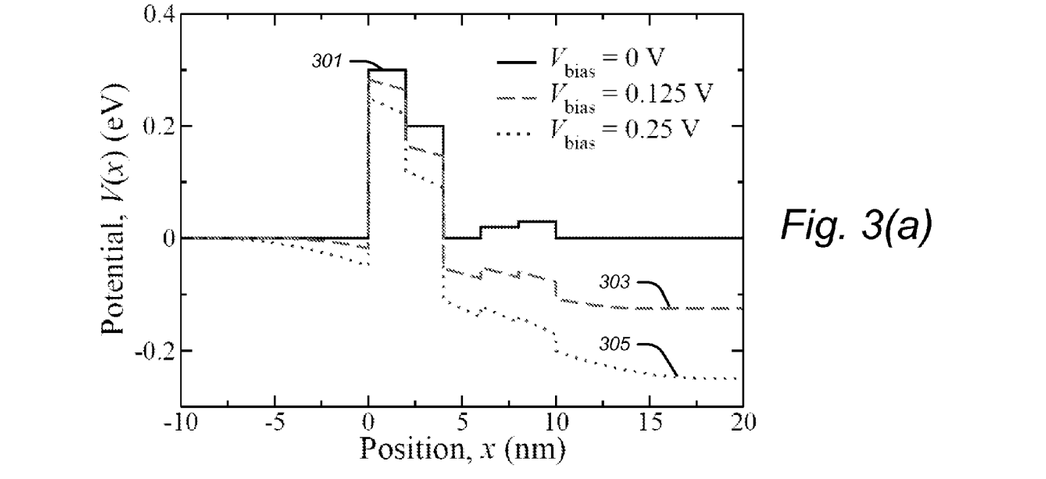
FIG. 3(a) illustrates an optimal conduction band profile that provides an electron transmission voltage characteristic that is linear.

FIG. 3(a) illustrates an optimal conduction band profile that provides an electron transmission voltage characteristic that is linear. FIG. 3(a) reflects a solution from an exhaustive numerical search for conduction band profiles that are predicted to give a linear $T(V_{bias})$ characteristic. $T(V_{bias})$ for the potentials in V(x) may be constrained to a region that is 10 nm wide and the maximum local potential may be 0.3 eV. Energy band 301 is for $V_{bias}=0$, energy band 303 is for $V_{bias}=0.125V$ and energy band 305 is for $V_{bias}=0.25V$.

Figure 3B:
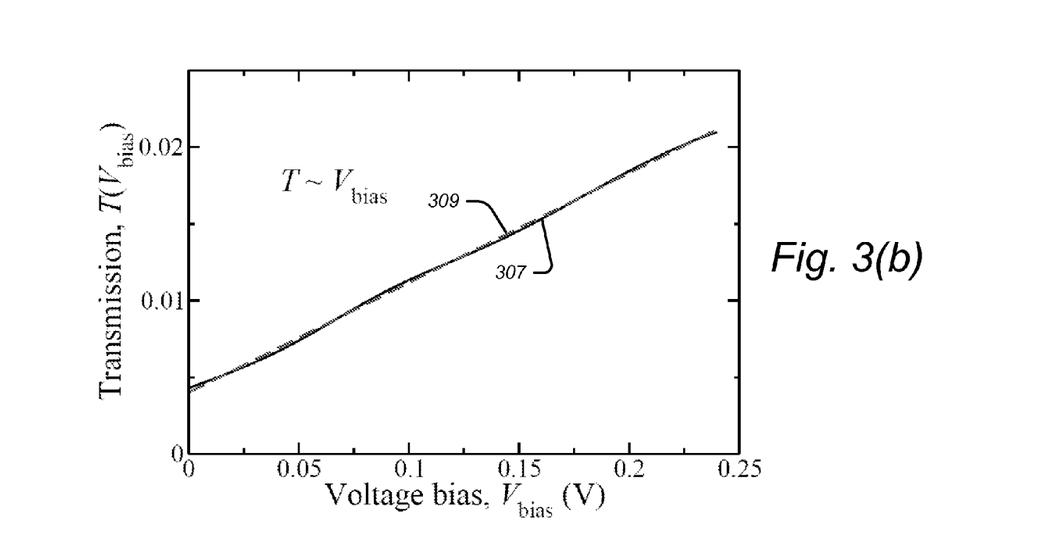
FIG. 3(b) illustrates the electron transmission voltage characteristic of the conduction band profile illustrated in FIG. 3(a).

FIG. 3(b) illustrates the electron transmission voltage characteristic for the conduction band profile illustrated in FIG. 3(a). The resulting $T(V_{bias})$ for an electron of energy E=26 meV incident from the left are shown as a solid line 307. A broken line 309 is a target response.

For the discrete grid discussed above, the size of the search space may be $30^5 \approx 2.4 \times 10^7$. The resulting broken-symmetry barrier solutions may be sequences of rectangular steps. For the case of the linear target function illustrated in FIGS. 3(a) and 3(b), the quadratic deviation of the obtained solution from the target may be $\chi^2=5.1\times10^{-7}$. When the search is restricted to monotonically decreasing potentials, the reduced size of the search space may allow a finer grid in space with $\Delta x=1$ nm (~4 monolayers in GaAs). The size of the search space may now be $40!/(10!30!) \approx 8.5\times10^8$. In this case, the quadratic deviation of the obtained solution from the linear target may be $\chi^2=4.5\times10^{-6}$.

Figure 4A:
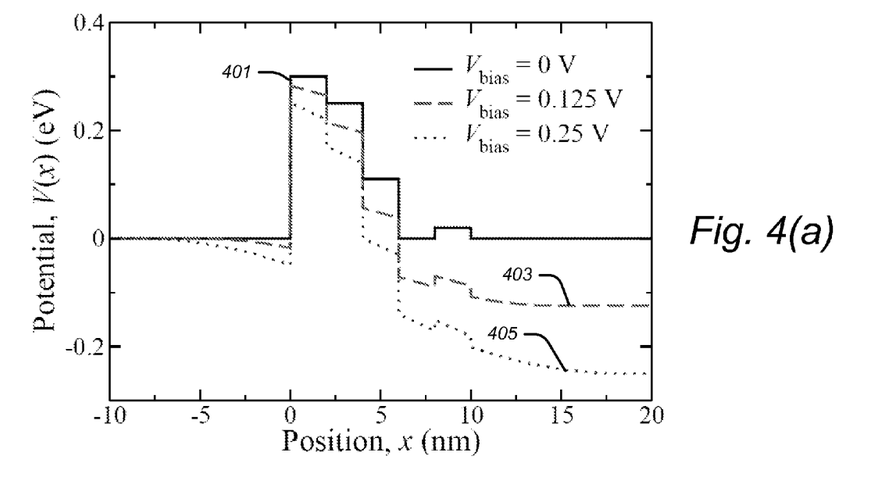
FIG. 4(a) illustrates an optimal conduction band profile that provides an electron transmission voltage characteristic that is a squared function.

FIG. 4(a) illustrates an optimal conduction band profile that provides an electron transmission voltage characteristic that is a squared function. It shows a solution of an exhaustive search for a potential profile with a quadratic transmission-voltage characteristic. In this case, the square deviation between solution and target may be $\chi^2=5.6\times10^{-8}$. Energy band 401 is for $V_{bias}=0$, energy band 403 is for $V_{bias}=0.125V$ and energy band 405 is for $V_{bias}=0.25V$.

Figure 4B:
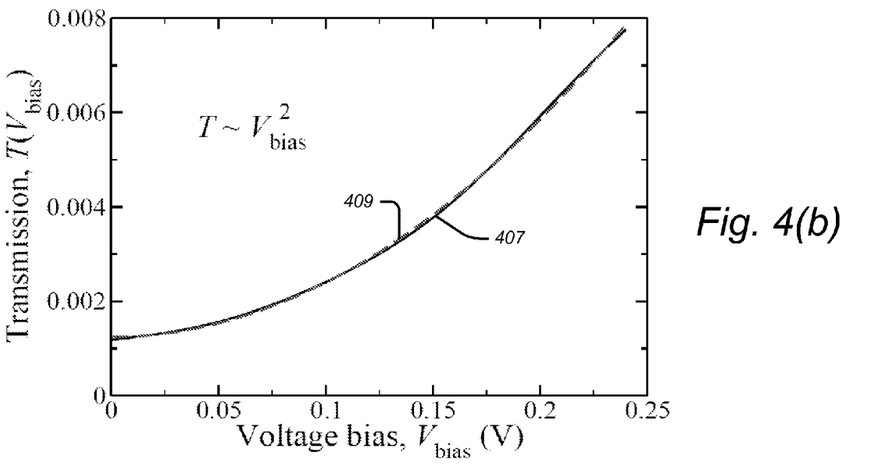
FIG. 4(b) illustrates the electron transmission voltage characteristic of the conduction band profile illustrated in FIG. 4(a).

FIG. 4(b) illustrates the electron transmission voltage characteristic of the conduction band profile illustrated in FIG. 4(a). The resulting $T(V_{bias})$ for an electron of energy E=26 meV incident from the left are shown as a solid line 407. A broken line 409 is a target response.

A semiconductor nanoscale structure with desired linear and power-law electron transmission-voltage characteristics may therefore be fabricated. In such devices, elastic scattering limits ballistic electron current flow and dissipative relaxation processes may occur in the electrodes. However, there may be a hierarchy of target functionalities. Some may be more accessible than others using the available building blocks. For example, a square-root target response may pose a much more challenging problem. The best solution identified by an exhaustive numerical search for this functionality may only have $\chi^2=6.6\times10^{-5}$.

A linear response in a ballistic nanostructure may be achieved by solely utilizing the physical ingredient of elastic scattering and tunneling at potential steps. The physics enabling power-law transmission as a function of $V_{bias}$ may be better understood from progressive evolution of solutions for the linear target from a simple square barrier to the multi-barrier profile of FIG. 3(a).

Figure 5A:
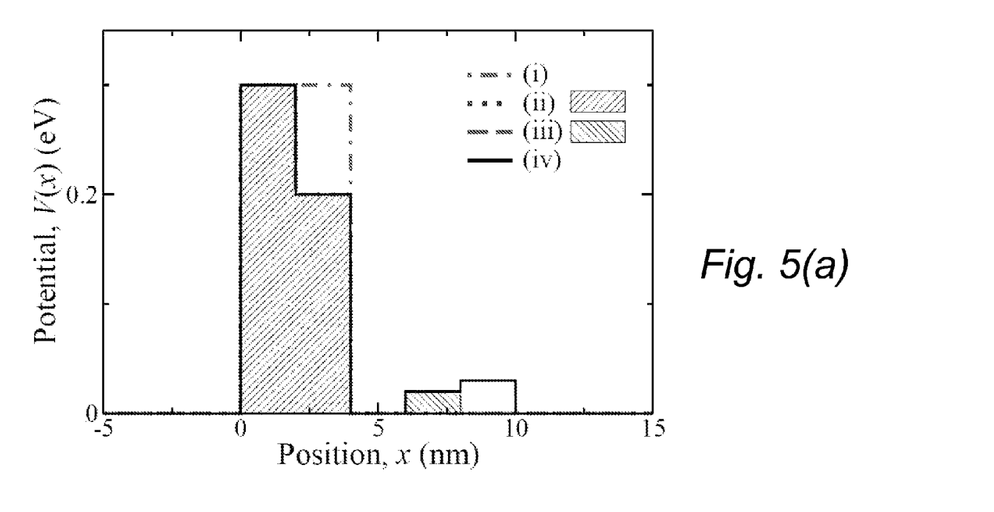
FIG. 5(a) illustrates additions of barriers in a conduction band profile of a semiconductor device.
Figure 5B:
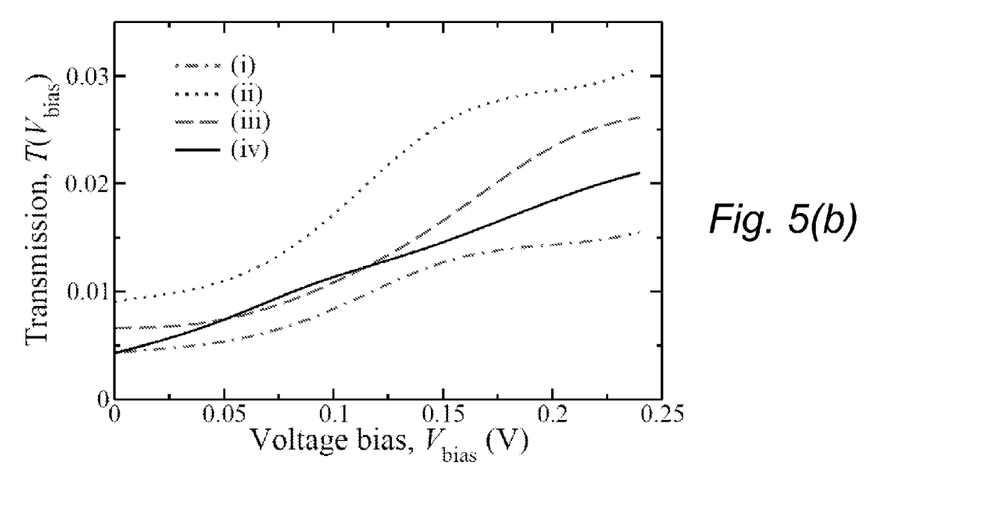
FIG. 5(b) illustrates how the additions of barriers in FIG. 5(a) affect the electron transmission voltage characteristic of the semiconductor device.

FIG. 5(a) illustrates additions of barriers in a conduction band profile of a semiconductor device. FIG. 5(b) illustrates how the additions of barriers affect the electron transmission voltage characteristic of the semiconductor device. Item (i) in FIG. 5(a) is single rectangular barrier of 4 nm and results in item (i) transmission voltage profile in FIG. 5(b). Item (ii) in FIG. 5(a) is a 4 nm wide barrier with a step and results in item (ii) transmission voltage profile in FIG. 5(b). Item (iii) in FIG. 5(a) is the same as item (ii) but adds a 1 nm wide small barrier and results in item (iii) transmission voltage profile in FIG. 5(b). Finally, item (iv) in FIG. 5(a) is an optimized profile and results in item (iv) transmission voltage profile in FIG. 5(b).

As illustrated by FIGS. 5(a) and 5(b), the superposition of broad resonances enables a linear transmission-voltage response. The dominant transmission features of the simple square well, i.e. the exponential behavior and resonances, may be altered by the addition of steps in the potential barrier profile. The superposition of broad resonances due to the presence of different potential steps may help linearize the transmission-voltage curve. This superposition of broad scattering resonances may also render the solution stable against small perturbations.

Figure 6A:
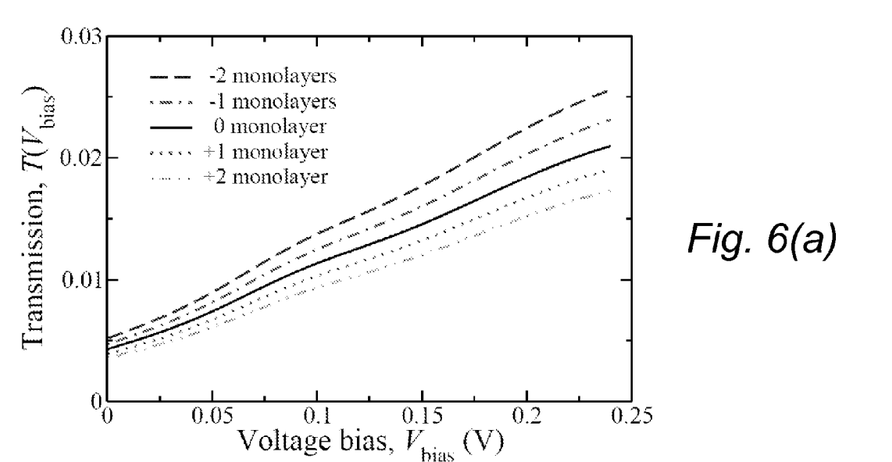
FIG. 6(a) illustrates how changes in monolayers at an initial highest barrier affects the electron transmission voltage characteristic of a semiconductor device.

Robustness of a solution to monolayer changes at each interface in the barrier array may be explored using sensitivity analysis. FIG. 6(a) illustrates how changes in the monolayers at an initial highest barrier may affect the electron transmission voltage characteristic of a semiconductor device. Changes of 1-2 monolayers at the initial highest barrier may mainly alter the slope of the transmission curve, i.e. the resistance. Results presented in FIG. 6(a) show that the slope of $T(V_{bias})$ may be determined by the initial highest barrier energy, whereas its smoothness may be governed by the low barrier energy tail of the array that controls the fast spatial modulations of the electron wave in the structure. Therefore, depending on the position of the deviations from the original structure, different components of the response function may be affected.

Smoothing the edges in the conduction band profile may also have an effect. Error function rounding of interfaces on the scale of two monolayers may change the linear transmission-voltage response of FIG. 3(b) only slightly, yielding a quadratic deviation of $\chi^2=5.7\times10^{-7}$.

Figure 6B:
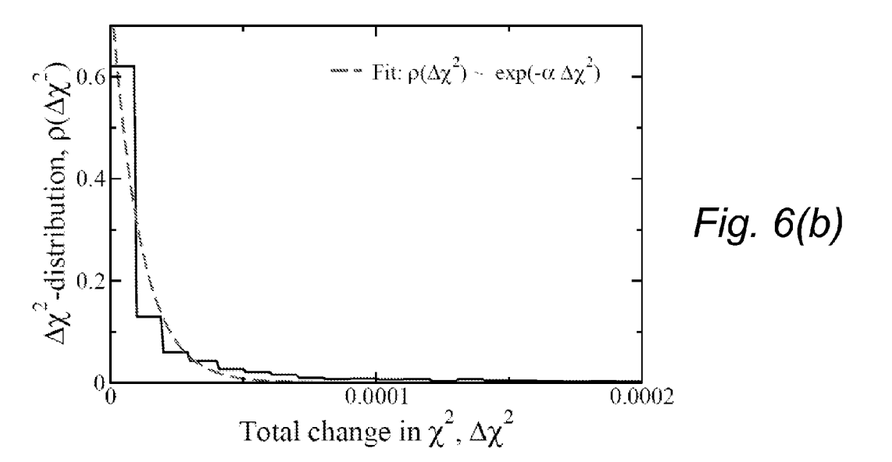
FIG. 6(b) illustrates how the changes in the monolayers in FIG. 6(a) affects changes in the electron transmission voltage characteristic of the semiconductor device.

FIG. 6(b) illustrates how the changes in monolayers affects changes in the electron transmission voltage characteristic of the semiconductor device. In FIG. 6(b), results are shown from a study of randomly selected 0, ±1 and ±2 monolayer changes at all interfaces in the barrier structure. The effect may be relatively small, yielding an average change of $1/\alpha \approx 10^{-5}$ in $\chi^2$, where $\alpha$ is the parameter of the exponential fit in FIG. 6(b). Moreover, the sensitivity of $\chi^2$ to changes in the potential energy due to random variations on the order of 1% in the Al concentration of $Al_xGa_{1-x}As$ may be found to be similar. Hence, the transmission characteristics enabled by the conduction band potential profile may be stable against small random variations.

Adaptive design may thus be applied to the synthesis of nanoscale devices with power-law transmission-voltage characteristics. Using a constrained exhaustive numerical search, broken-symmetry conduction band profiles of semi-conductor hetero-structures may be identified which enable desired quantum transport functionality. This custom-designed superposition of broad scattering resonances due to the presence of an optimal potential may make it possible to "recreate" Ohm's law within a window of bias voltages in a system that is dominated by ballistic electron transport. In particular, one can synthesize a nanoscale two-terminal linear resistive element that is robust against monolayer perturbations.

The components, steps, features, objects, benefits and advantages that have been discussed are merely illustrative. None of them, nor the discussions relating to them, are intended to limit the scope of protection in any way. Numerous other embodiments are also contemplated, including embodiments that have fewer, additional, and/or different components, steps, features, objects, benefits and advantages. The components and steps may also be arranged and ordered differently.

The phrase "means for" when used in a claim embraces the corresponding structures and materials that have been described and their equivalents. Similarly, the phrase "step for" when used in a claim embraces the corresponding acts that have been described and their equivalents. The absence of these phrases means that the claim is not limited to any of the corresponding structures, materials, or acts or to their equivalents.

Nothing that has been stated or illustrated is intended to cause a dedication of any component, step, feature, object, benefit, advantage, or equivalent to the public, regardless of whether it is recited in the claims.

In short, the scope of protection is limited solely by the claims that now follow. That scope is intended to be as broad as is reasonably consistent with the language that is used in the claims and to encompass all structural and functional equivalents.

I claim:

1. A method of fabricating a semiconductor device so as to cause the device to have a desired electronic response transfer characteristic comprising:
   performing computations that predict an electronic response transfer characteristic of the semiconductor device for each of a plurality of different sets of values of available control parameters that may be used during the fabrication of the semiconductor device;
   identifying a set of values of available control parameters that the computations predict will cause the semiconductor device to substantially provide the desired electronic response transfer characteristic; and
   fabricating the semiconductor device based on the set of values of available fabrication control parameters that is identified.

2. The method of claim 1 wherein the electronic response transfer characteristic is an electron transmission characteristic.

3. The method of claim 1 wherein the electronic response transfer characteristic is a current voltage characteristic.

4. The method of claim 1 wherein electron motion in the semiconductor device is substantially limited by quantum mechanical transmission.

5. The method of claim 1 wherein:
   the semiconductor device has a conduction and valence band;
   at least one of the available control parameters within each set of values relates to the conduction or valence band; and
   the conduction or valence band is fabricated based on the value of the at least one control parameter within the set of values that is identified.

6. The method of claim 5 wherein each of the sets of values of available control parameters includes varying the local potential in spatial increments across the conduction or valence band.

7. The method of claim 6 wherein the spatial increments span less than 20 nm.

8. The method of claim 6 wherein each of the spatial increments are between the thickness of an atomic layer and 20 nm.

9. The method of claim 6 wherein the spatial increments are substantially equal.

10. The method of claim 6 wherein the local potentials are selected from a discreet set of values.

11. The method of claim 1 wherein the computations are derived from a propagation matrix method that solves the Schrödinger equation in a piece-wise fashion.

12. The method of claim 1 wherein the desired electronic response transfer characteristic of the semiconductor device is for when electron motion in the semiconductor device is not at thermal equilibrium.

13. The method of claim 12 wherein electron motion in the semiconductor device is substantially limited by quantum mechanical transmission.

14. The method of claim 1 wherein the desired electronic response transfer characteristic of the semiconductor device is a polynomial function.

15. The method of claim 14 wherein the polynomial function is a linear function.

16. The method of claim 14 wherein the polynomial function is a squared function.

17. The method of claim 1 further comprising determining the sets of values on which computations are performed utilizing optimal design techniques.

18. The method of claim 1 further comprising fabricating a plurality of the semiconductor devices in accordance with the set of values of available fabrication control parameters that is identified.

19. The method of claim 1 wherein the semiconductor device is fabricated so as to substantially match the set of values of available control parameters that is identified.

20. The method of claim 1 wherein the set of values of available control parameters that the computations predict will cause the semiconductor device to most closely provide the desired electronic response transfer characteristic is identified.

21. A semiconductor device that provides an electronic response transfer characteristic that is a linear function when electron motion in the semiconductor device is not at thermal equilibrium.

22. The semiconductor device of claim 21 wherein the semiconductor device has a conduction and valance band and wherein the conduction or valence band is configured to cause the semiconductor device to provide an electronic response transfer characteristic that is a linear function.

23. A semiconductor device that provides an electronic response transfer characteristic that is a squared function when electron motion in the semiconductor device is not at thermal equilibrium.

24. The semiconductor device of claim 23 wherein the semiconductor device has a conduction and valence band and wherein the conduction or valence band is configured to cause the semiconductor device to provide an electronic response transfer characteristic that is a squared function.

25. A semiconductor device made by the process recited in claim 1.

* * * * *

UNITED STATES PATENT AND TRADEMARK OFFICE
CERTIFICATE OF CORRECTION

PATENT NO. : 7,463,998 B2
APPLICATION NO. : 11/673319
DATED : December 9, 2008
INVENTOR(S) : Anthony Levi

It is certified that error appears in the above-identified patent and that said Letters Patent is hereby corrected as shown below:

Column 1, lines 16-19, should appear as follows:

--Portions of this-- "This" invention --were-- "was" made with government support under --DARPA Grant-- "Contract" No. N00014-05-1-0317 awarded by the --United States Government-- "Office of Naval Research". The government has certain rights in the invention.

Signed and Sealed this

Twenty-fifth Day of May, 2010

David J. Kappos
*Director of the United States Patent and Trademark Office*